United States Patent [19]

Takahashi

[11] Patent Number: 4,591,790
[45] Date of Patent: May 27, 1986

[54] DIAGNOSTIC NUCLEAR MAGNETIC RESONANCE APPARATUS

[75] Inventor: Ryouichi Takahashi, Ootawara, Japan

[73] Assignee: Kabushiki Kaisha Toshiba, Japan

[21] Appl. No.: 603,676

[22] Filed: Apr. 25, 1984

[30] Foreign Application Priority Data

Apr. 30, 1983 [JP] Japan .............................. 58-66074[U]

[51] Int. Cl.$^4$ ........................ G01R 33/20; H01F 27/30
[52] U.S. Cl. ..................................... 324/318; 336/197
[58] Field of Search ............. 324/309, 318, 319, 320, 324/300; 335/216; 336/92, 199, 197, DIG. 1

[56] References Cited

U.S. PATENT DOCUMENTS 4,398,150  8/1983  Barjhoux et al. ................... 324/319
4,468,621  8/1984  Hinshaw ............................. 324/307
4,509,011  4/1985  Sugimoto et al. .................... 324/318

OTHER PUBLICATIONS

Partain et al., "Nuclear Magnetic Resonance NMR Imaging," Chapter 18, pp. 250-252, (W. B. Sanders Co. 1983).

Primary Examiner—Reinhard J. Eisenzopf
Assistant Examiner—Kevin D. O'Shea
Attorney, Agent, or Firm—Finnegan, Henderson, Farabow, Garrett & Dunner

[57] ABSTRACT

Disclosed is a diagnostic nuclear magnetic resonance apparatus which comprises a pair of coil units having substantially the same construction and a base bearing the coil units. Each coil unit includes a large coil, a small coil, and a frame structure fixing the large and small coils so that the axes of the two coils are in alignment with each other. In the frame structure, a pair of frames, each consisting of four frame members fixed at right angles at each end portion, are arranged at a suitable space. The small coil is removably attached to one of the frames. The large coil is disposed between and fixed to the two frames. The two coil units are joined together so that their respective large coils adjoin each other, and the two frame structures are fixed to each other by means of bolts and nuts. Also, the frame structures are fixed to the base by means of bolts and nuts. The coil units and the base can be separated from one another when transferring and carrying the apparatus.

15 Claims, 5 Drawing Figures

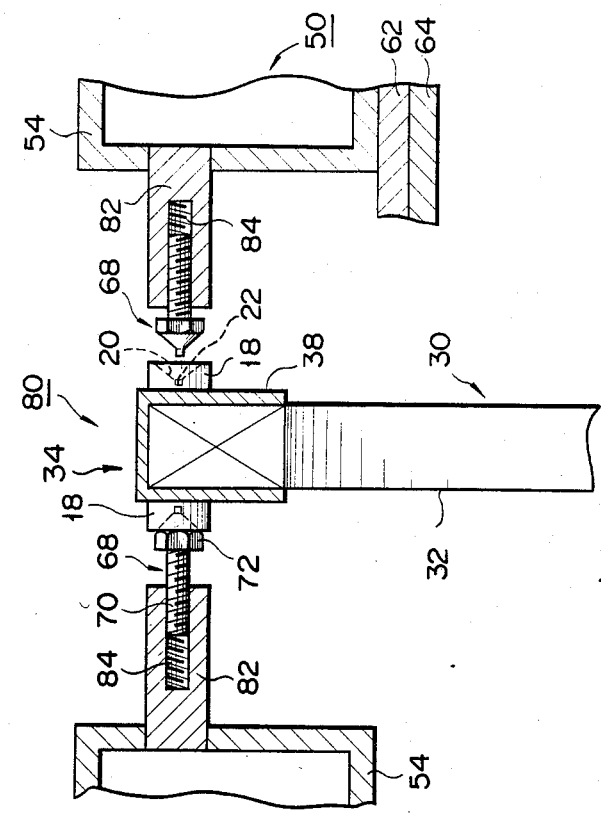
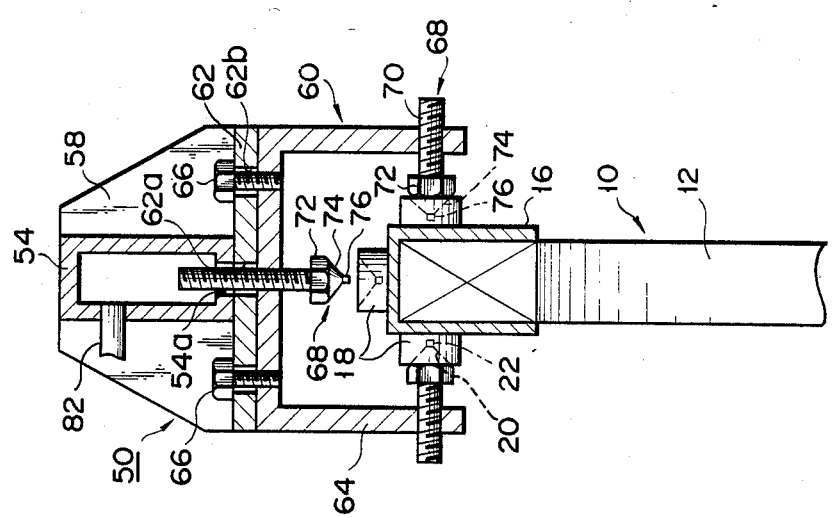

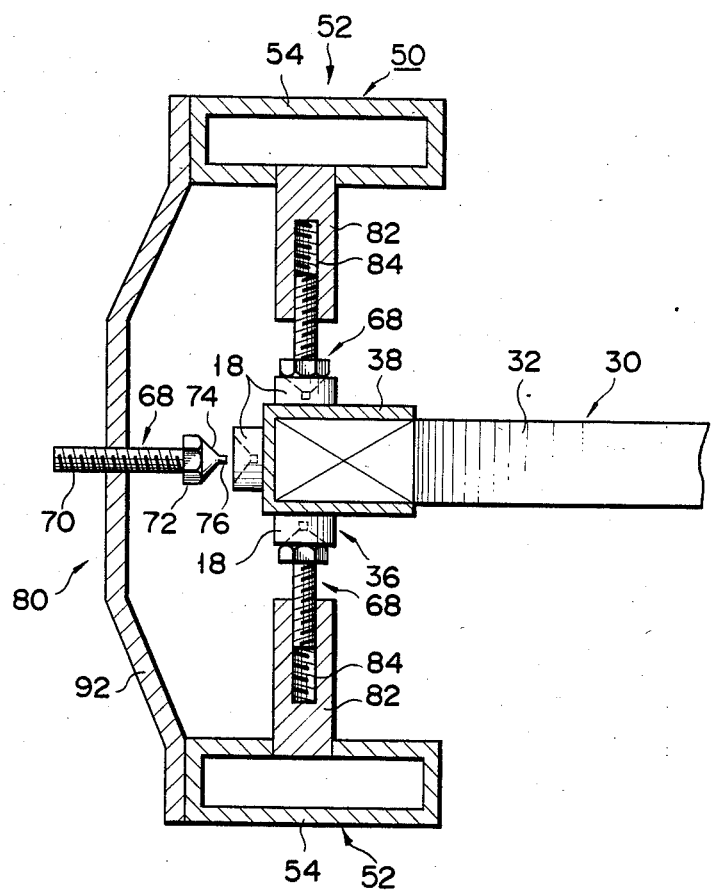

DIAGNOSTIC NUCLEAR MAGNETIC RESONANCE APPARATUS

BACKGROUND OF THE INVENTION

The present invention relates to a diagnostic nuclear magnetic resonance apparatus, and more specifically to a diagnostic nuclear magnetic resonance apparatus capable of being divided into three parts for transportation and of being assembled on-the-spot.

When applying nuclear magnetic resonance (hereinafter abbreviated NMR) to the diagnosis of a human disease, a subject is placed in a uniform magnetostatic field, an inclined magnetic field is superposed on the uniform magnetostatic field, and an exciting rotary magnetic field is then applied to produce an NMR phenomenon. An NMR signal delivered from the subject is detected, and information on the projected area of the subject is obtained. Image information on at least one of the spin densities and relaxation time constants of a specific atomic nucleus of the subject can be obtained by subjecting the projection information to image reconstruction processing. A diagnosis is made on the basis of this image information.

In a diagnostic NMR apparatus, a pair of large air-core coils are arranged in alignment with each other, and a pair of small air-core coils are disposed in alignment with the large coils so that the large coils are sandwiched between the small coils. A uniform magnetostatic field is produced by energizing these four symmetrically arranged air-core coils.

In order to produce an NMR phenomenon, the uniform magnetostatic field needs to be high in intensity and uniform in the image region in which the subject is placed. Accordingly, the four air-core coils are large-sized and heavy in weight. The four air-core coils apply great magnetic forces to one another, so that a heavy load is imposed on the support frames which fix the air-core coils. In order to securely support the air-core coils in an accurate positional relation, therefore, the frames are expected to have high mechanical strength and rigidity. Thus, the frames themselves are increased in size and weight. Consequently, in installing the NMR apparatus in a treatment room of a hospital, transportation, carrying-in, setting-up, and other operations should be very difficult. If the entrance of the treatment room is narrow, it will be impossible to install the NMR apparatus in the room. Moreover, limited room size will put restrictions on the size of the apparatus and hence on its performance.

SUMMARY OF THE INVENTION

The object of the present invention is to provide a nuclear magnetic resonance apparatus facilitating installation work in treatment rooms of hospitals, including transportation, carrying-in, setting-up, and other operations.

According to the invention, there is provided a diagnostic nuclear magnetic resonance apparatus which applies a magnetostatic field to a subject to produce a nuclear magnetic resonance phenomenon, which detects a nuclear magnetic resonance signal delivered from the subject, and which obtains information on the internal conditions of the subject on the basis of the signal. This apparatus comprises a pair of coil units each including a frame structure, a large coil and a small coil adapted to generate magnetic fields when energized, and supporting means for fixing the large and small coils individually to the frame structure, a base mounted with the pair of coil units, and assembling means for fixing and separating the respective frame structures of the coil units to and from each other and to and from the base in a manner such that the respective large coils of the coil units adjoin each other.

In this nuclear magnetic resonance apparatus, the coil units and the base can be transferred and carried-in separately. After all these components are carried into, for example, a hospital treatment room, the apparatus is assembled by fixing the respective frame structures of the coil units by the assembling means. Thus, the apparatus can be transferred with ease despite its bulkiness, and can even be carried into a room with a narrow entrance. Moreover, the nuclear magnetic resonance apparatus can easily be installed in a small treatment room

BRIEF DESCRIPTION OF THE DRAWINGS

FIG. 3 is a sectional view showing supporting means for a small coil;

FIG. 4 is a sectional view showing supporting means for a large coil; and

FIG. 5 is a sectional view showing another supporting means for the large coil.

DETAILED DESCRIPTION OF THE PREFERRED EMBODIMENT

Figure 1:
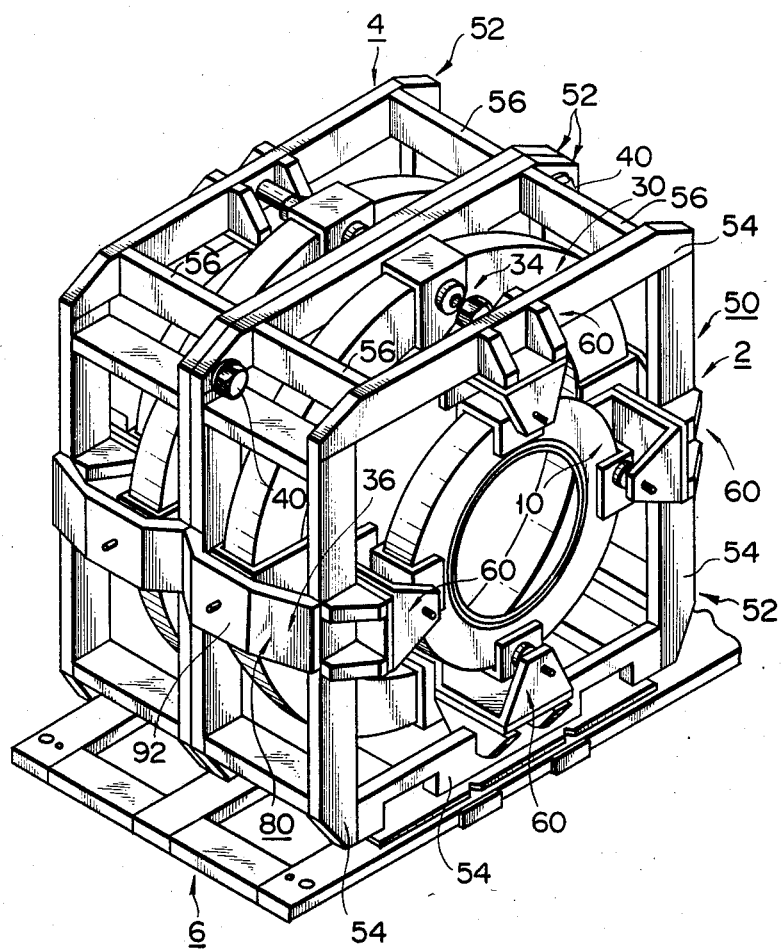
FIG. 1 is a perspective view of a nuclear magnetic resonance apparatus according to an embodiment of the present invention.

FIGS. 1 to 5 show a diagnostic nuclear magnetic resonance apparatus according to one embodiment of the present invention. This apparatus comprises two coil units 2 and 4 and a base 6. The coil units 2 and 4 have substantially the same construction, each mainly consisting of a small coil 10, a large coil 30, and a frame structure 50. The frame structure 50 includes a pair of frames 52 which are each formed by fixing four elongated frame members 54 at each end portion. The two frames 52 are suitably spaced and fixed to each other by means of frame members 56 at their respective four corner portions.

The small coil 10 is fixed to one of the paired frames 52. The supporting means 60 are arranged at substantially regular intervals along the circumference of a coil body 12 of the small coil 10 (at the top and bottom portions and both lateral side portions) so as to fix the coil 10 to the frame structure 50. Each of these supporting means 60 includes a reinforcement seat plate 16 having a U-shaped cross section and fixed to the coil body 12. The seat plates 16 are formed of an elastic material and are fitted on the coil body 12. The coil body 12 can be fixed without being damaged by clamping the seat plates 16. Seat plates 18 for clamping each seat plate 16 are arranged on three outer faces of the seat plate 16 without being fixed thereto. Each seat plate 18 is in the form of a disk having a conical cavity 20 opening to its outer flat face. A small cylindrical recess 22 is formed at the bottom of the conical cavity 20.

Each supporting means 60 includes clamp members 68 attached to the frame 52. Each frame member 54 is in the form of a hollow square pillar. A fixing plate 62 is welded to that lateral face of the frame member 54 on the side of the coil body 12. The fixing plate 62 is reinforced by reinforcement members 58, which are fixed to each corresponding frame member 54 and the fixing plate 62 in an intersecting relation. Through holes 62b are formed in the four corner portions of the fixing plate 62. A fixing member 64 having a U-shaped cross section is fixed to the fixing plate 62 by means of bolts 66 inserted in the through holes 62b. The clamp members 68 are attached individually to the three sides of the fixing member 64. Each clamp member 68 has a screw portion 70 screwed in the fixing member 64, a hexagonal head portion 72 at one end of the screw portion 70, a conical engaging portion on the top of the head portion 72, and a small cylindrical projection 76 on the tip of the engaging portion 74. The clamp members 68 are moved toward and away from the seat plate 16 on the small coil 10 as their head portions 72 are rotated. That clamp member 68, which extends in the radial direction of the coil body 12, projects into the hollow space of the frame member 54 via through holes 62a and 54a in the fixing plate 62 and the frame member 54. Thus, this clamp member 68 can be advanced toward or retreated from its corresponding seat plate 18 by a full stroke or more without being hindered by the frame member 54.

The engaging portion 74 of each clamp member 68 engages the cavity 20 of each corresponding seat plate 18, while the small projection 72 is fitted in the small recess 22. Those clamp members 68 which face each other across the thickness of the coil body 12 have their engaging portions 74 fitted in their corresponding cavities 20 when the head portions 72 of the clamp members 68 are rotated to move the clamp members 68 toward their corresponding seat plates 18 with the small coil 10 held in the position shows in FIG. 3. Thus, the coil body 12 is fixed by the clamp members 68 with the aid of the seat plates 16 and 18. In removing the coil body 12 from the frame structure 50, the clamp members 68 are rotated so as to leave the coil body 12. In doing this, the seat plates 18, which are not fixed to the seat plate 16, will possibly fall unless they are supported by some suitable means. Since the small projections 76 are fitted in the small recesses 22, however, the seat plates 18 will not fall by only loosening the clamp members 68. The position of the coil body 12 relative to that of the frame member 54 is regulated by adjusting the position of that clamp member 68 which extends in the radial direction of the coil body 12. The engaging portion 74 of the clamp member 68 and the cavity 20 of its corresponding seat plate 18, which have the same conical configuration, can engage each other even though the clamp member is inclined against the seat plate 18. The clamp member 68 extending in the radial direction of the coil body 12 is rotated so that it approaches the leaves the coil body 12. The clamp member 68 holds the seat plate 18 against the coil body 12 so that the engaging portion 74 of the clamp member 68 is fitted in the cavity 20 of the seat plate 18. The position of the small coil 10 relative to the frame 52 can be regulated by adjusting the positions of the clamp members 68 relative to the frame 52.

The large coil 30 is disposed between each pair of frames 52 and fixed to the frame members 54. Supporting means 80 are arranged at substantially regular intervals along the circumference of a coil body 32 of the large coil 30 so as to fix the coil 30 to the frame structure 50. These supporting means 80 include an upper supporting device 34 attached to the top portion of the coil body 32 of the large coil 30, and three lower supporting devices 36 attached to the bottom portion and both lateral side portions of the coil body 32. Each of the supporting devices 34 and 36 has a reinforcement seat plate 38 similar to the seat plate 16. Seat plates 18 are arranged to clamp the seat plate 38. As shown in the vertical sectional view of FIG. 4, the supporting device 34 has only a pair of seat plates 18 arranged across the thickness of the coil body 32. As shown in the cross-sectional view of FIG. 5, each of the supporting devices 36 has a seat plate 18 on the peripheral surface of the coil body 32 as well as a pair of seat plates 18 arranged across the thickness of the coil body 32.

The supporting device 34 is provided with a pair of cylindrical bosses 82. Each boss 82 has a cylindrical threaded cavity 84 extending along its longitudinal direction. The bosses 82 are welded to the opposed surfaces of their corresponding upper frame members 54 of the frame structure 50, and face each other with the coil body 32 between them. The direction of the bosses 82 fixed in this manner is horizontal. A clamp member 68 is screwed in each threaded cavity 84. The engaging portions 74 of the two clamp members 68 are moved toward each other by rotating the head portions 72 of the clamp members 68. Thus, the coil body 32 is clamped and held by the clamp members 68 with the aid of the seat plates 38 and 18.

The supporting devices 36 are each provided with a pair of bosses 82 fixed individually to the pair of frame members 54. The coil body 32 is held by clamp members 68, screwed individually in threaded cavities 84 of the bosses 82, with the air of the seat plates 18 and 38. A supporting plate 92 is stretched between the pair of frame members 54 on each side of the coil body 32. One of the clamp members 68 is screwed in the supporting plate 92. The clamp member 68 moves toward or away from the coil body 32 as its head portion 72 is rotated. Having its engaging portion 74 fitted in the cavity of its corresponding seat plate 18, the clamp member 68 regulates the position of the coil body 32 through the medium of the seat plate 18. The relative positions of the large coil 30 and the frame structure 50 can be regulated by adjusting the relative positions of the supporting plate 92 and the clamp member 68. The seat plates 16, 18 and 38 and the clamp members 68 may be formed from nonmagnetic stainless steel, such as austenitic stainless steel, or brass.

The coil unit 4 has the same construction as the coil unit 2. The base 6 is placed on the floor of a treatment room in a hospital, and the coil units 2 and 4 are mounted on the base 6. The coil units 2 and 4 are joined together so that their small coils 10 are on the outside, and are fixed to each other at their four corner portions by means of bolts 40 and nuts 42. Also, the coil units 2 and 4 are fixed to the base 6 by means of bolts and nuts (not shown).

Figure 2:
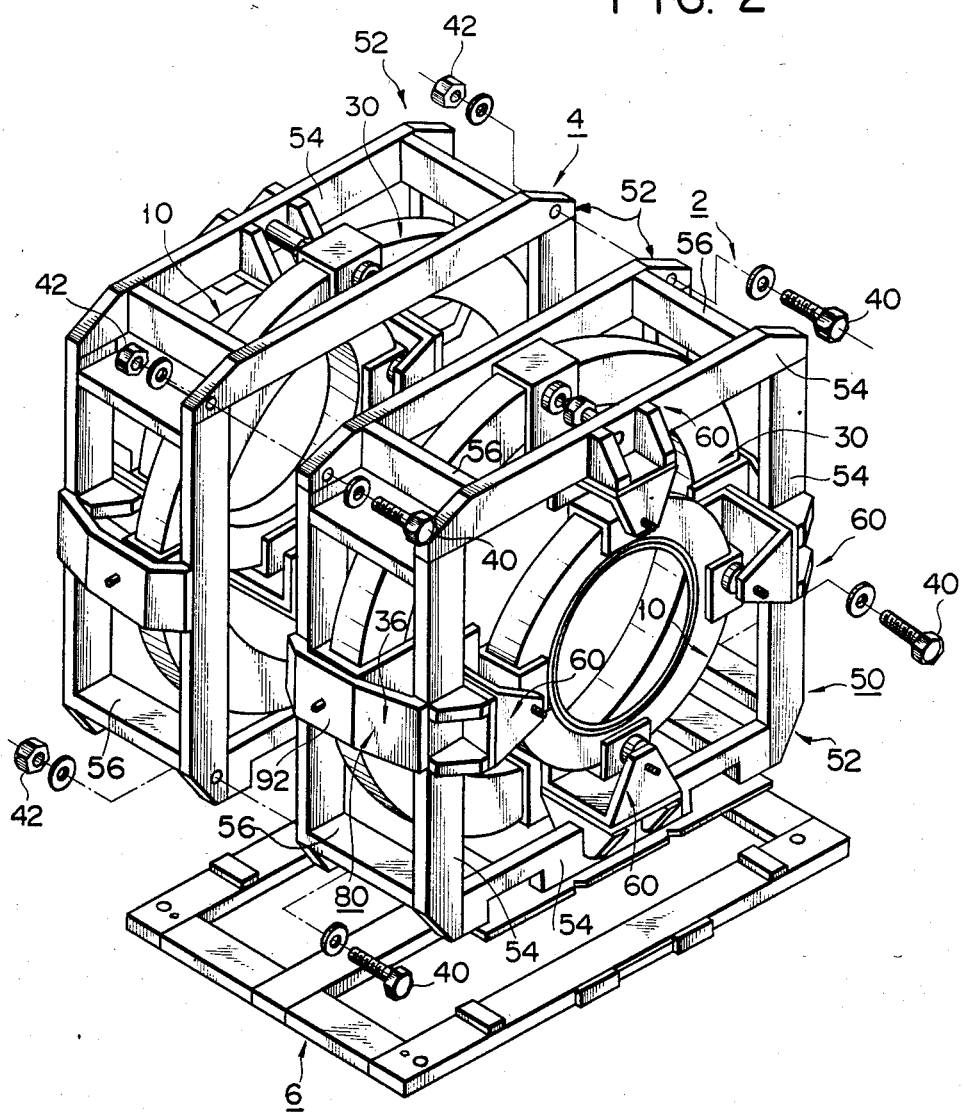
FIG. 2 is a disassembled perspective view of the apparatus of FIG. 1.

In the apparatus constructed in this manner, the disassembled coil units 2 and 4 and base 6 are carried, as shown in FIG. 2, into the treatment room. In the treatment room, the coil units 2 and 4 and base 6 are fixed by means of the bolts 40 and the nuts 42, etc. Then, those clamp members 68 which extend along the thickness of the large and small coils 30 and 10 are slightly loosened so that the large and small coils 30 and 10 can move in their radial directions. In this case, the seat plates 18 will never fall since the small projections 76 are fitted in the small recesses 22. Then, the relative positions of the coil bodies 12 and 32 are regulated to align their axes by adjusting the positions of those clamp members 68, extending in the radial directions of the large and small coils 30 and 10 relative to the frame members 54. Thereafter, the large and small coils 30 and 10 are all fixed to the frame structures 50 in an aligned manner by clamping those clamp members 68 arranged across the thickness of the large and small coils 30 and 10. Thus, the nuclear magnetic resonance apparatus can be assembled in the treatment room. When this apparatus is to be transferred to another treatment room, it need only be disassembled by removing the bolts 40 and the nuts 42, etc.

When transferring and carrying in the apparatus, each of the coil units 2 and 4 may be disassembled into the small and large coils 10 and 30 and the frame structure 50. In this case, mounting the coils 30 and 10 on the frame structures 50 and positioning operation for the alignment of the coil axes are performed on the spot.

What is claimed is:

1. A diagnostic nuclear magnetic resonance apparatus, which applies a magnetostatic field to a subject to produce a nuclear magnetic resonance phenomenon, detects a nuclear magnetic resonance signal delivered from the subject, and obtains information on the internal conditions of the subject on the basis of the signal, comprising:
   a pair of coil units each including a frame structure, a large coil and a small coil adapted to generate magnetic fields when energized, and supporting means for fixing the large and small coils individually to the frame structure;
   a base mounted with said pair of coil units; and
   assembling means for fixing and separating the respective frame structures of the coil units to and from each other and to and from the base in a manner such that the respective large coils of the coil units adjoin each other.

2. The diagnostic nuclear magnetic resonance apparatus according to claim 1, wherein each said frame structure includes a pair of frames each formed of four frame members fixed substantially at right angles to one another at each end portion to form four corner portions, and frame members fixing the frames at a suitable space, so that the small coil is supported on one of the frames and the large coil is supported between the two frames.

3. The diagnostic nuclear magnetic resonance apparatus according to claim 2, wherein said assembling means includes bolts and nuts.

4. The diagnostic nuclear magnetic resonance apparatus according to claim 3, wherein said assembling means are arranged at said four corner portions of each said frame.

5. The diagnostic nuclear magnetic resonance apparatus according to claim 4, wherein said supporting means are arranged substantially at regular intervals along the circumferences of the large and small coils.

6. The diagnostic nuclear magnetic resonance apparatus according to claim 5, wherein each said supporting means for the small coil includes a fixed seat plate fixed to the small coil, a pair of separate seat plates abutting against the fixed seat plate on each side of the small coil across the thickness thereof and each having an engaging cavity, and a pair of clamp members attached to each corresponding frame member on each side of the small coil across the thickness thereof so as to be movable toward the small coil and each having an engaging portion to engage each corresponding engaging cavity, so that said pair of clamp members holds the small coil in a manner such that the engaging portions engage their corresponding engaging cavities.

7. The diagnostic nuclear magnetic resonance apparatus according to claim 6, wherein each said supporting means for the small coil includes a separate seat plate abutting against the fixed seat plate on the outer peripheral surface side of the small coil and having an engaging cavity, and a clamp member attached to each corresponding frame member so as to be movable in the radial direction of the small coil and having an engaging portion to engage the engaging cavity, so that said clamp member regulates the position of the small coil to adjust the radial position thereof in a manner such that the engaging portion engages the engaging cavity.

8. The diagnostic nuclear magnetic resonance apparatus according to claim 7, wherein said engaging portions and said engaging cavities are conical, each said clamp member has a small projection formed at the tip end of each engaging portion, and each said separate seat plate has a small recess to engage the small projection.

9. The diagnostic nuclear magnetic resonance apparatus according to claim 8, wherein each said supporting means for the small coil includes a fixing member fixed to each corresponding frame member and fitted with the clamp members.

10. The diagnostic nuclear magnetic resonance apparatus according to claim 9, wherein each said clamp member has a screw portion, and said fixing member has tapped holes in which are fitted the screw portions of the clamp member, so that the clamp members are moved toward or away from the small coil by being rotated.

11. The diagnostic nuclear magnetic resonance apparatus according to claim 5, wherein each said supporting means for the large coil includes a fixed seat plate fixed to the large coil, a pair of separate seat plates abutting against the fixed seat plate on each side of the large coil across the thickness thereof and each having an engaging cavity, and a pair of clamp members attached to each corresponding frame member on each side of the large coil across the thickness thereof so as to be movable toward the large coil and each having an engaging portion to engage each corresponding engaging cavity, so that said pair of clamp members holds the large coil in a manner such that the engaging portions engage their corresponding engaging cavities.

12. The diagnostic nuclear magnetic resonance apparatus according to claim 11, wherein each said supporting means for the large coil includes a separate seat plate abutting against the fixed seat plate on the outer peripheral surface side of the large coil and having an engaging cavity, and a clamp member attached to each corresponding frame member so as to be movable in the radial direction of the large coil and having an engaging portion to engage the engaging cavity, so that said clamp member regulates the position of the large coil to adjust the radial position thereof in a manner such that the engaging portion engages the engaging cavity.

13. The diagnostic nuclear magnetic resonance apparatus according to claim 12, wherein said engaging portions and said engaging cavities are conical, each said clamp member has a small projection formed at the tip end of each engaging portion, and each said separate seat plate has a small recess to engage the small projection.

14. The diagnostic nuclear magnetic resonance apparatus according to claim 13, wherein each said clamp member has a screw portion, and each said supporting means for the large coil has a pair of bosses formed on the opposed faces of the frame members, each said boss having a threaded cavity extending toward the large coil and in which the screw portion is screwed, so that the clamp members are moved toward or away from the large coil by being rotated.

15. The diagnostic nuclear magnetic resonance apparatus according to claim 14, wherein each said supporting means for the large coil includes a supporting plate stretched between the frame members on both sides of the large coil, said supporting plate having a taped hole in which the screw portion of its corresponding clamp member is screwed, so that the clamp member is moved toward or away from the large coil by being rotated.

* * * * *